(12) United States Patent
Gyoutoku et al.

(10) Patent No.: US 6,416,886 B1
(45) Date of Patent: Jul. 9, 2002

(54) ORGANIC ELECTROLUMINESCENCE DEVICE AND MANUFACTURING METHOD THEREOF

(75) Inventors: Akira Gyoutoku, Kiyama-machi; Hideaki Iwanaga, Umi-machi, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/170,556

(22) Filed: Oct. 13, 1998

(30) Foreign Application Priority Data

Oct. 14, 1997 (JP) .............................................. 9-280124

(51) Int. Cl.[7] .............................................. H05B 33/02

(52) U.S. Cl. ........................ 428/690; 428/917; 313/503; 313/505; 257/91; 257/99

(58) Field of Search ................................. 428/690, 917; 313/503, 505; 257/91, 99

(56) References Cited

U.S. PATENT DOCUMENTS

| | | | | | |
|---|---|---|---|---|---|
| 4,342,945 | A | * | 8/1982 | Ketchpel | 313/505 |
| 5,189,549 | A | * | 2/1993 | Leventis et al. | 359/271 |
| 5,400,047 | A | * | 3/1995 | Beesley | 313/503 |
| 5,742,129 | A | * | 4/1998 | Nagayama et al. | 315/167 |
| 5,952,037 | A | * | 9/1999 | Nagayama et al. | 427/66 |
| 6,107,734 | A | * | 8/2000 | Tanaka et al. | 313/506 |
| 6,111,356 | A | * | 8/2000 | Roitman et al. | 313/506 |

* cited by examiner

Primary Examiner—Cynthia H. Kelly
Assistant Examiner—Dawn Garrett
(74) Attorney, Agent, or Firm—Pearne & Gordon LLP

(57) ABSTRACT

An organic electroluminescent device comprising a plurality of first electrodes of transparent conductive film patterns formed on a transparent substrate; an organic thin film formed on the first electrodes; and a second electrode formed on the organic thin film, wherein a recess, which is an interval region between the first electrodes, is embedded with a photo resist. Therefore, even if the thickness of the first electrodes is increased, the occurrence of defective coverage at the edge portion of first electrodes can be prevented.

5 Claims, 4 Drawing Sheets

ORGANIC ELECTROLUMINESCENCE DEVICE AND MANUFACTURING METHOD THEREOF

BACKGROUND OF THE INVENTION

1. Field of the Invention

The present invention relates to an electroluminescence device, which will be referred to as "an organic EL device" in this specification hereinafter, used as an element of an organic electroluminescence display. More particularly, the present invention relates to an organic EL device in which resistance of ITO (Indium Tin Oxide) film is reduced by increasing the thickness of ITO film when a transparent conductive film such as ITO film is formed as an anode so that short circuit between the anode and the cathode can be effectively prevented. Also, the present invention relates to a method of manufacturing the organic EL device.

2. Description of the Related Art

Concerning the organic EL device used for a back light of a liquid crystal display, a display applied to various types of display units and a light source of optical communication, by controlling its luminescent material and layer structure, it is possible to obtain various luminescent wave length including blue luminescence, which is difficult to obtain by a conventional inorganic EL device. Therefore, the organic EL device is widely used in the fields of various luminescent devices and color displays.

According to the basic method of manufacturing an organic EL device, it is manufactured as follows. For example, ITO film, which is known as a transparent conductive film, is formed on the surface of a glass substrate so that ITO film can be used as a transparent anode. Organic thin film is laminated on this ITO film. Further, a cathode, which composes a pair together with the anode formed by ITO film, is formed on this organic thin film by means of metallic vapor deposition.

When the size of a display composed of pixels of the above organic EL devices is increased, the following problems may be encountered. The overall ITO film is formed in a wide range. Therefore, resistance of ITO film is increased. As a result, it is impossible to avoid an increase in applied voltage. Also, when it is necessary to provide a higher resolution, the pattern width is reduced, and resistance is increased. Therefore, voltage is increased in the same manner as that described above. For the above reasons, in order to apply the organic EL devices to an image plane of a large size, it is necessary to reduce specific resistance of ITO to be used, or alternatively, it is effective to increase the film thickness of ITO film. This is owing to a reason that the larger the thickness of ITO film is, the lower the resistance is.

However, according to the physical property of ITO film, specific resistance of ITO film can be reduced to a predetermined value (p=150 to 200 $\mu\Omega$·cm) Therefore, in order to apply the organic EL device to an image plane of a large size, the countermeasure which has been taken up to this time is not sufficient. And also in order to increase the resolution of an image plane, the countermeasure which has been taken up to this time is not sufficient.

On the other hand, by increasing the thickness of ITO film, it is possible to reduce the resistance sufficiently. However, when the thickness of ITO film is increased, the transmittance is deteriorated. Therefore, it is difficult to obtain a sufficiently high intensity of light because of the deterioration of transmittance. Further, the following new problem may be caused. Since the organic thin film formed on ITO film is thinner than ITO film, when the thickness of ITO film is increased, an anode composed of this ITO film is short-circuited with a metallic cathode formed on the organic thin film.

FIG. 3 is a schematic illustration showing an arrangement of a conventional example in which there is a possibility that the anode is electrically communicated (short-circuited) with the cathode when the thickness of ITO film is increased. In the above arrangement, ITO film 52 is formed on a transparent glass substrate 51 by depositing step and patterning step. On this ITO film 52, there is formed an organic thin film 53 which is an organic EL medium. Further, on this organic thin film 53, there is formed a metallic cathode 54 by means of vapor-deposition.

An upper limit of the thickness of the organic thin film 53 is approximately 200 nm at most. When the thickness of the organic thin film 53 is increased to a value higher than that, problems are caused in the characteristics of the organic thin film 53. On the other hand, in order to apply ITO film 52 to an image plane of a large size and high resolution, it is preferable that the thickness of ITO film is not less than 300 nm. For the above reasons, it is difficult for the organic thin film, which is an insulating material (semiconductor), to cover ITO film 52 completely. Especially, in an edge portion of an upper end of ITO film, a defective coverage of the organic thin film 53 tends to occur. In the case of occurrence of a defective coverage of the organic thin film 53, ITO film 52 and the cathode 54 are short-circuited with each other, and the characteristic is deteriorated. That is, when the thickness of ITO film 52 is increased, an increase in the resistance can be suppressed. Therefore, it is possible to apply it to an image plane of a large size. However, due to the above short circuit, a local luminescent trouble is caused, and further a cross talk is caused by a leakage of electrical current.

As described above, the increase in the thickness of ITO film 52 is effective to maintain resistance low, however, a difference in level between ITO film 52 and a surface of the glass substrate 51 is made, which causes a new problem. For the above reasons, instead of the above manufacturing method, there is provided a manufacturing method shown in FIGS. 4A–4D.

Processes according to manufacturing method are shown in FIGS. 4A–4D First, ITO film 52 is deposited on the glass substrate 51 and patterned to anode patterns by photolithography (FIG. 4A). After that, $SiO_2$ film 55 is formed on the anode patterns of ITO film 52 (FIG. 4B). A resist 56 is coated on the $SiO_2$ film 55 and patterned by photolithography (FIG. 4C). Further, when the $SiO_2$ film 55 is etched by using the resist 56 as a mask and then the resist 56 is removed. Therefore $SiO_2$ film 55 is embedded between the anode patterns of ITO film 52 as shown in FIG. 4D. In this way, a difference in level of the surface of the anode patterns of ITO film 52 from that of other area on the glass substrate 51 can be suppressed.

When $SiO_2$ 55 is embedded between the anode patterns of ITO film 52, although it is impossible to make the entire surface flat, it is possible to suppress the occurrence of a defective coverage of the organic thin film 54 at the edge portion of the anode patterns of ITO film 52. Due to the foregoing, when the cathode 54 is formed as shown in FIG. 3, it is possible to prevent a short circuit between anode patterns of ITO film 52 and the cathode 54. Therefore, not only it becomes possible to reduce resistance by increasing the thickness of ITO film 52, but also the occurrence of cross talk caused by short circuit after the formation of films can be suppressed.

However, according to the above manufacturing method, the following processes are required. After ITO film 52 is subjected to etching on the glass substrate 51 by using a resist pattern as the mask, $SiO_2$ 55 is formed on the overall surface, and then patterning is conducted in accordance with the mask pattern for patterning the ITO film 52. After that, $SiO_2$ 55 is subjected to etching, so that $SiO_2$ 55 can be embedded only into a clearance (an interval region) between the anode patterns of ITO film 52. That is, it is necessary to conduct patterning not less than twice for the formation anode patterns of ITO film 52 and embedded patterns of $SiO_2$ 55. Further, it is necessary to conduct patterning of $SiO_2$ 55 in accordance with anode patterns of ITO film 52. For the above reasons, a high accuracy is required for the mask alignment, which greatly affects the yield of products. Even if the above method is adopted, it is impossible to make the overall surface flat when $SiO_2$ 55 is formed.

According to the above manufacturing method, $SiO_2$ 55 is dependently formed only for the purpose of preventing the short circuit between ITO film 52 and cathode 54, that is, $SiO_2$ 55 nevercontributes to the luminescent characteristics such as a luminescent intensity. Although the manufacturing cost is increased only a little by the material expense of $SiO_2$ 55, the manufacturing process becomes complicated because of the forming process of $SiO_2$ 55 and the matching process of matching the mask, and further the yield of product is deteriorated.

SUMMARY OF THE INVENTION

An object of the present invention is to provide an organic EL device characterized in that: the thickness of ITO film is ensured so that an increase in its electric resistance can be suppressed; and a coverage of the organic thin film is excellently maintained in an edge portion so that short circuit between the first electrode and the second electrode can be prevented. Also, it is an object of the present invention to provide a method of manufacturing the organic EL device.

The present invention provides an organic electroluminescence device comprising:

a plurality of first electrodes of transparent conductive film patterns formed on a transparent substrate;

an organic thin film formed on the first electrodes; and a second electrode formed on the organic thin film, wherein a recess, which is an interval region between the first electrodes, is embedded with a photo resist.

According to the above structure, even if the thickness of the first electrode is increased, it is possible to prevent the occurrence of defective coverage of the organic thin film at the edge portion of the first electrode. Therefore, the occurrence of a short circuit between the first and the second electrode can be positively prevented.

The present invention provides a method of manufacturing an organic electroluminescence device, comprising the steps of:

forming a transparent conductive film on a transparent substrate;

forming an operational film so as to a light shielding layer;

selectively etching the operational film and the transparent conductive film successively to form a plurality of first electrodes covered with the operational film patterns coincide with the first electrodes;

forming a photosensitive film on an entire surface of the substrate on which the first electrodes and the operational film patterns are formed;

exposing the photosensitive film by injecting a light from a side of the operational film patterns and developing it so that the photosensitive film exposed from the light without being shielded by the operational film patterns, is remained;

removing the operational film;

forming an organic thin film on the first electrodes and the photosensitive film remained; and forming a second electrode on the organic thin film.

According to the above manufacturing method, the operational film through which no light is transmitted is formed corresponding to the first electrode. Namely, only region of the photoresist film, not covered with the first electrode and the operational film, is exposed and developed to be remained. Therefore it is possible to remain a cured negative type resist film so as to be embedded in the interval region between the first electrodes, without conducting a mask alignment.

DESCRIPTION OF THE PREFERRED EMBODIMENT

The first aspect of the present application provides an organic electroluminescence device, comprises: a first electrode obtained when a transparent conductive film on a transparent substrate is subjected to patterning; an organic thin film respectively laminated on the first electrode which has been subjected to patterning; and a second electrode laminated on the organic thin film. Further, a recess, which is an interval region between the first electrodes formed toward the substrate, is embedded with photocurable resin used for resist so that the thickness of photocurable resin can be substantially the same as the thickness of the first electrode.

According to the invention, even if the thickness of the first electrode is increased, it is possible to prevent the occurrence of a defective coverage of the organic thin film at the edge portion, so that a short circuit between the first and the second electrode can be positively prevented.

The second aspect of the present application provides a method of manufacturing an organic electroluminescence device described in the first aspect, comprises the steps of: forming an operational film on the transparent conductive film, an etchant of the operational film being different from an etchant of the transparent conductive film, no light being transmitted through the operational film because of the thickness of the operational film; forming the first electrode in accordance with the patterning of the transparent conductive film by successively etching the operational film and the transparent conductive film; covering the operational film including an interval region between the first electrode with a negative type resist film made of photocurable resin; and leaving a negative type resist film, the thickness of which is the same as the thickness of the first electrode, in the interval region between the first electrode by exposure conducted from the substrate side and also by development conducted successively. Due to the above arrangement, the operational film through which no light is transmitted is formed corresponding to the first electrode. Accordingly, only when exposure and development are conducted after the negative type resist film has been laminated, the cured negative type resist film can be left as it is in the interval region between the first electrodes.

Referring to the accompanying drawings, a embodiment of the present invention will be explained below.

FIGS. 1A–1F are views showing the manufacturing method of the present invention in which processes from the start to the formation of ITO film are successively shown. FIGS. 2A–2E are views showing processes following the processes shown in FIGS. 1A–1F, wherein processes to obtain a final product are shown in this view.

Figure 1A:
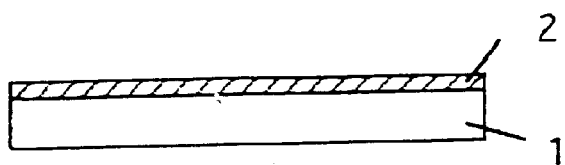
FIGS. 1A–1F are views showing a manufacturing method of the present invention in which processes from the start to the formation of ITO film are successively shown.

As shown in FIG. 1A, ITO film 2, which is finally formed into a transparent anode as first electrode, is previously formed on the glass substrate 1 by means of spattering. Thickness of this ITO film 2 is approximately 0.1 to 0.5 μm. This ITO film 2 is cleaned together with the glass substrate 1 by means of hand cleaning with neutral detergent and ultrasonic cleaning.

Figure 1B:
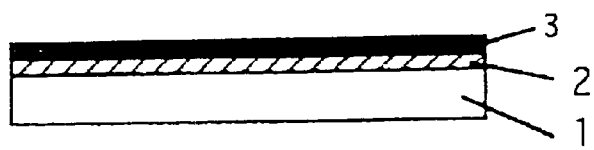

Next, as shown in FIG. 1B, Cr layer 3 is formed on ITO film 2 by the method of metallic vapor deposition. At this time, the vapor deposition rate of Cr is 10.50 A/min, and the thickness of Cr layer 3 is set at a value not less than 2500 A so that no light can be transmitted through the Cr layer 3.

Figure 1C:
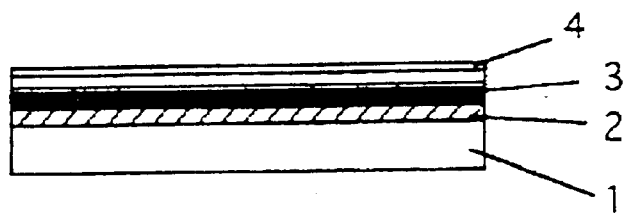

As shown in FIG. 1C, the positive type resist film 4 is formed on ITO film 2 by the method of spin coating. For example, this positive type resist film 4 was made of OFPR-800, which is the brand name of Tokyo Oka Kogyo K.K., under the condition that the rotating speed of spin coating was 2000 rpm and prebaking was conducted at 80° C. for 20 minutes.

Figure 1D:
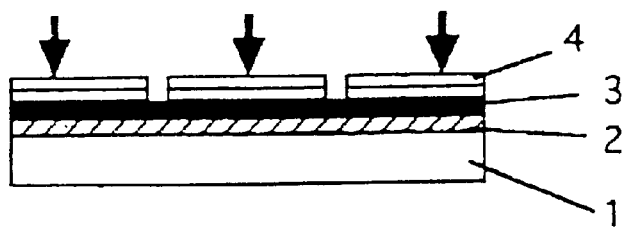

Next, as shown in FIG. 1D, after the formation of the positive type resist film 4, patterning is conducted on the positive type resist film 4 by exposure in accordance with the mask pattern. This patterning is conducted in such a manner that the positive type resist film 4 is exposed for 20 to 30 seconds in accordance with the mask pattern which has been previously prepared and then post-baking is conducted at 100° C. for 20 minutes.

Figure 1E:
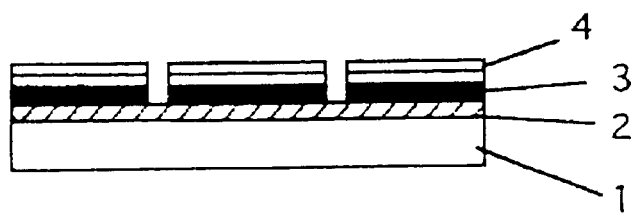
Figure 1F:
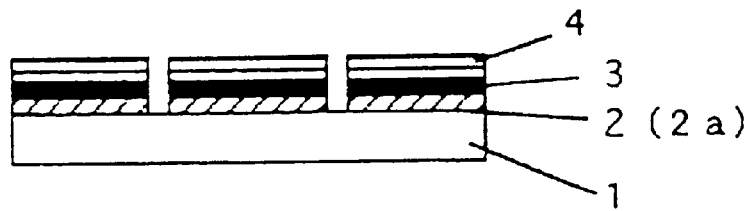

As described above, the forming pattern for forming the transparent electrode can be obtained when ITO film 2 is etched by patterning the positive type resist film 4. Before this formation, Cr layer 3 is subjected to etching as shown in FIG. 1E. This operation can be easily conducted by means of wet etching. In this case, an etching solution is used in which 85 g of cerium acetate ammonia and 25 g of perchloric acid are contained in 500 cc of water. The etching time is approximately 2 minutes.

After the completion of etching of Cr layer 3, in order to form a pattern of the transparent electrode of ITO film 2, ITO film 2 is subjected to etching. This etching is conducted by means of wet etching. In this case, an etching solution of dilute hydrochloric acid, the temperature of which is 60° C., is used, and the etching time is 2 to 3 minutes.

In the process described above, a transparent anode is obtained, which is composed in such a manner that ITO film 2 is patterned on the glass substrate 1. After that, as shown in FIGS. 2A–2E, insulating material is embedded between the anode patterns, so that the overall ITO film 2, which has been patterned in the form of the anode, can be made flat uniformly.

Figure 2A:
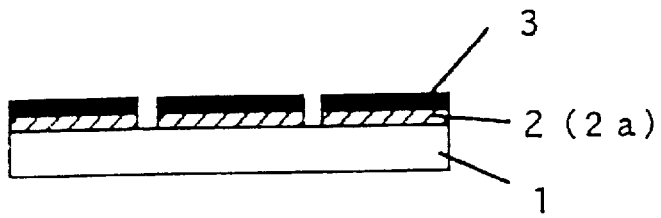
FIGS. 2A–2E are views showing processes following the processes shown in FIGS. 1A–1F, wherein processes to obtain a final product are shown in this view.

First, the positive type resist film 4, which has been formed for patterning the anode, is removed as shown in FIG. 2A. In order to remove this positive type resist film 4, ultrasonic cleaning may be conducted in which acetone is used, and also ultrasonic cleaning may be conducted in which 2% KOH is used, and finally cleaning may be conducted in water.

Figure 2B:
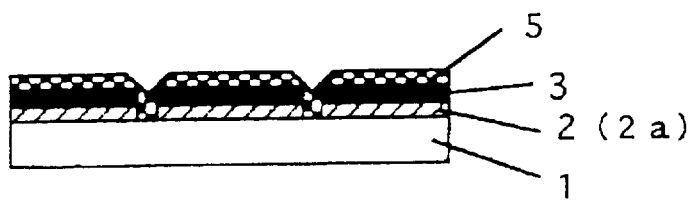
Figure 2C:
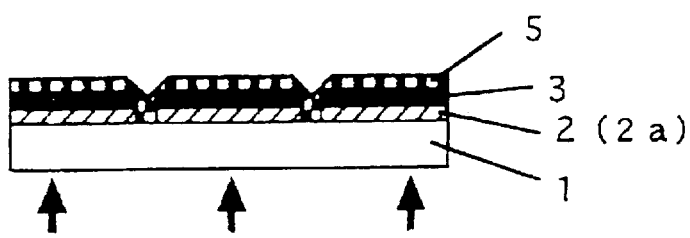

Due to the foregoing, only ITO film 2, which has been patterned as the anode, and Cr layer 3, which has been laminated on ITO film in accordance with the patterning to the thickness through which no light is transmitted, are left on the glass substrate 1. In the next process, the negative type resist film 5 is formed as shown in FIG. 2B.

For example, this negative type resist film 5 was made of OMR-83, which is the brand name of Tokyo Oka Kogyo K.K., under the condition that the rotating speed of spin coating was 3000 rpm and prebaking was conducted for 20 minutes at 80° C. The negative type resist film 5 is formed as described above. As shown in the drawing, an upper surface of Cr layer 3 is coated with the negative type resist film 5, and at the same time, the negative type resist film 5 is uniformly embedded between the transparent anode patterns 2a formed by patterning ITO film 2. In this connection, the condition of formation of the negative type resist film 5 may be arbitrarily selected according to the thickness of ITO film 2 and the viscosity of the negative type resist film 5. When the condition of formation of the negative type resist film 5 is optimized, it is possible to perfectly flatten spaces between ITO films 2 by embedding the negative type resist film 5 into the spaces.

After the negative type resist film 5 has been formed, light for exposure is incident from the glass substrate 1 side. As long as light is injected in this direction, the negative type resist film 5 formed on Cr layer 3, the thickness of which is sufficiently large so that no light can be transmitted through the layer, can not be exposed, and only the negative type resist film 5 of a portion facing the transparent glass substrate 1 is exposed, that is, only the negative type resist film 5 embedded between the anode patterns 2a composed of ITO film 2 is exposed.

Figure 2D:
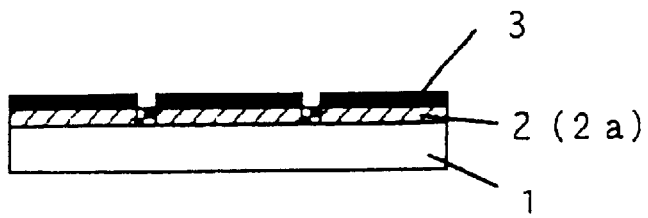

According to the characteristic of the negative type resist film 5, when light is transmitted through the negative type resist film 5, it is cured. Therefore, the negative type resist film 5 provided between the anode patterns 2a is cured when it is exposed to light, however, the negative type resist film 5 provided on Cr layer 3 is not cured. Therefore, after the completion of formation of the negative type resist film 5, development is conducted in a developing solution of OMR (n-heptane: 70%, xylene: 30%) for about 1 minute, and then rinse is conducted in an OMR rinsing solution (butyl acetate) for about 30 seconds. Due to the foregoing, as shown in FIG. 2D, the negative type resist film 5, which has been formed on Cr layer 3, is removed, and only the negative type resist film 5, which is located between the anode patterns 2a and exposed to light, is left like a joint. After that, in order to cure the negative type resist film 5, post baking is conducted at 140° C. for 30 minutes.

Since Cr layer 3 is left on the anode patterns 2a of ITO film 2, it is removed by etching. In this etching step, it is possible to adopt wet etching. In this case, an etching solution is used in which 85 g of cerium acetate ammonia and 25 g of perchloric acid are contained in 500 cc of water. The etching time is approximately 2 minutes.

When Cr layer 3 is removed by etching, the pattern of the cured negative type resist film 5 left between the anode patterns 2a which are arranged at regular intervals, is obtained. This negative type resist film 5 is cured in the process of development, and the negative type resist film 5 adhering to the outer periphery of Cr layer 3 is peeled off simultaneously with the Cr layer 3 to be removed by wet etching. Accordingly, it is possible to form a pattern on which the negative type resist film 5, the thickness of which is the same as that of the anode patterns 2a, is embedded between the anode patterns 2a.

Figure 2E:
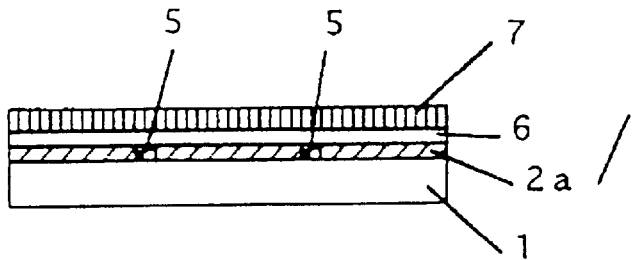
Figure 3:
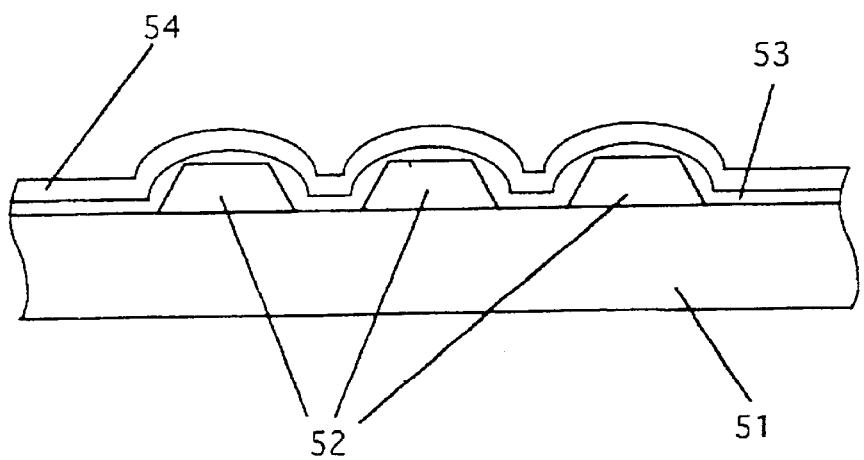
FIG. 3 is a schematic illustration showing a conventional example of the structure in which there is a possibility that the anode is short-circuited with the cathode when the thickness of ITO film is increased.
Figure 4A:
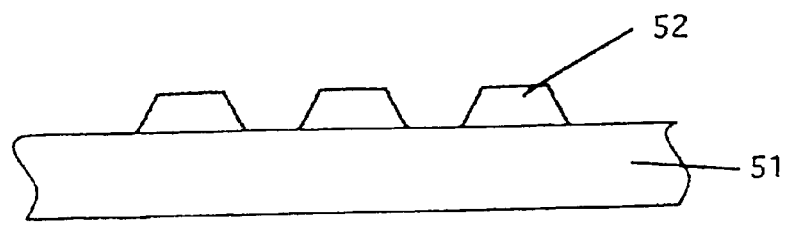
FIGS. 4A–4D are views showing the processes of a conventional method in which $SiO_2$ is embedded between ITO films so that the surface can be made flat.
Figure 4B:
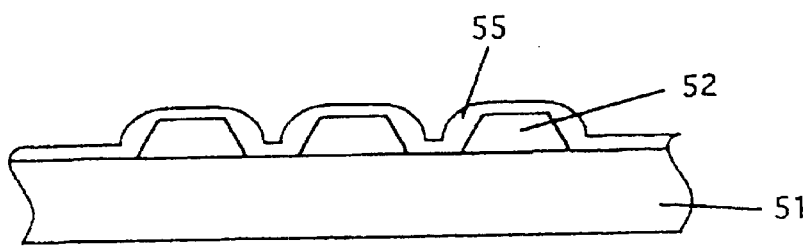
Figure 4C:
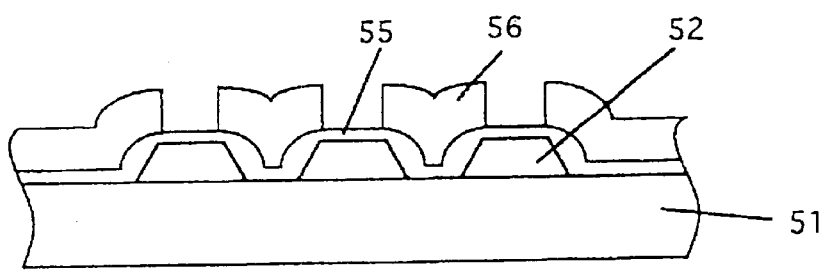
Figure 4D:
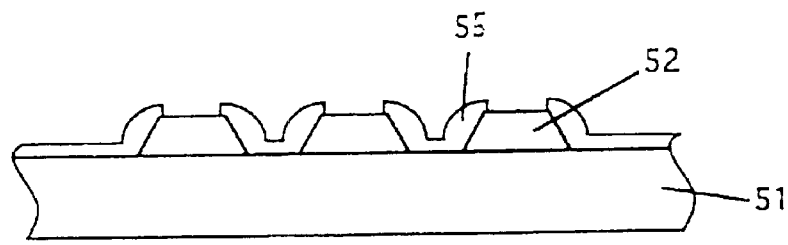
Figure 1A:
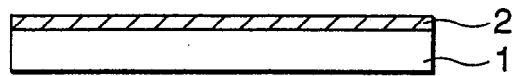
Figure 1B:
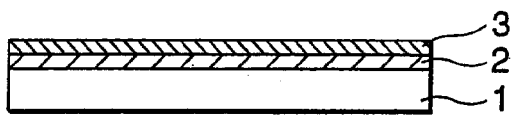
Figure 1C:
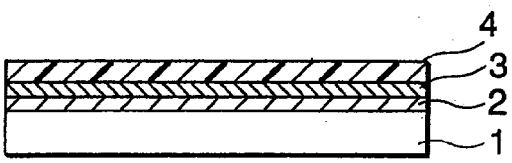
Figure 1D:
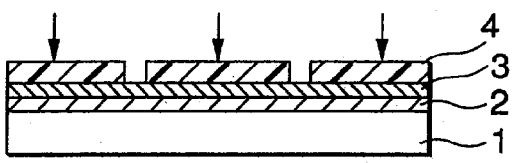
Figure 1E:
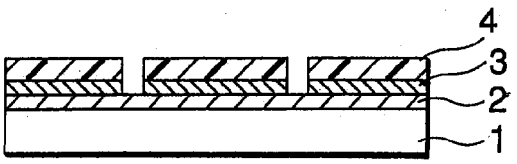
Figure 1F:
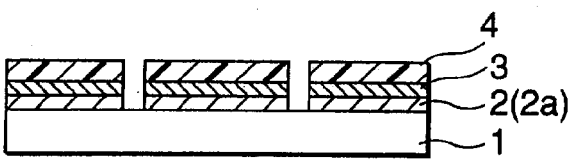
Figure 2A:
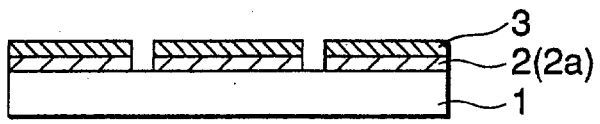
Figure 2B:
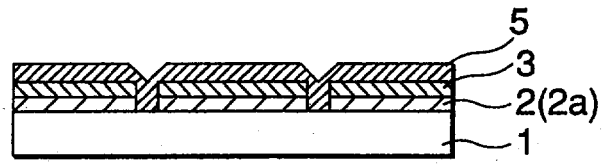
Figure 2C:
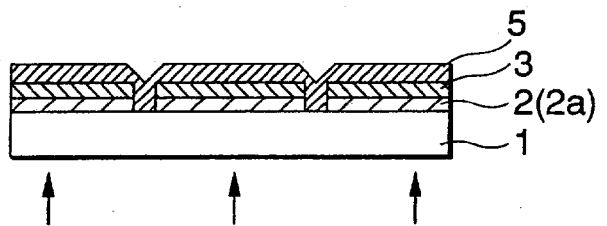
Figure 2D:
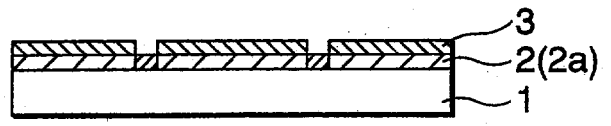
Figure 2E:
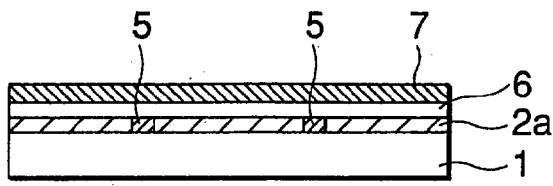
Figure 3:
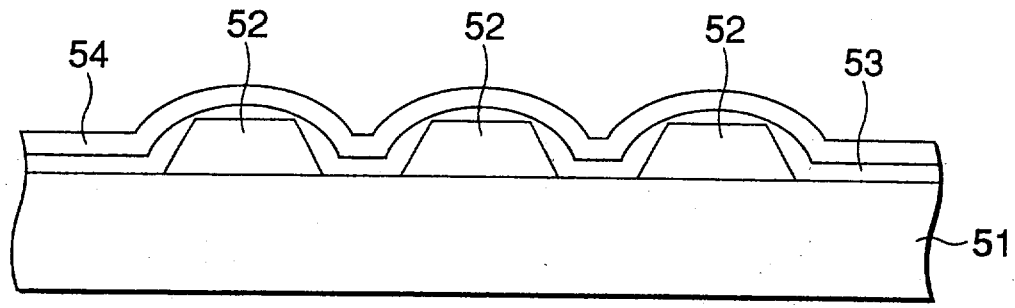
Figure 4A:
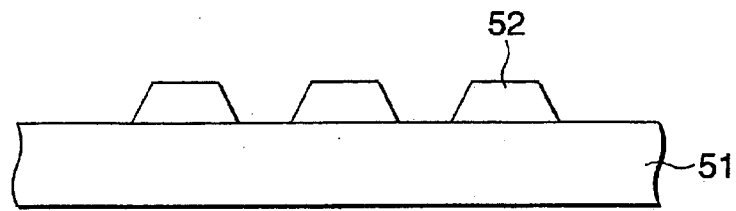
Figure 4B:
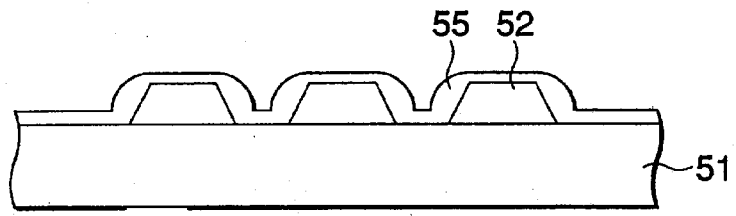
Figure 4C:
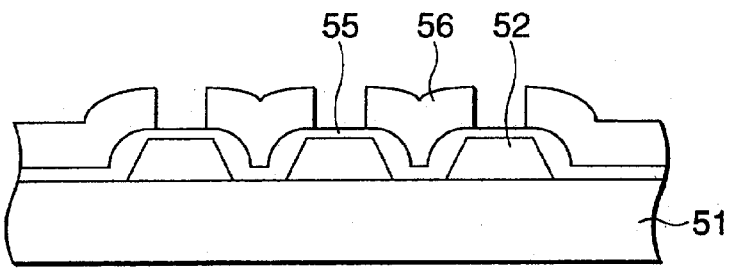
Figure 4D:
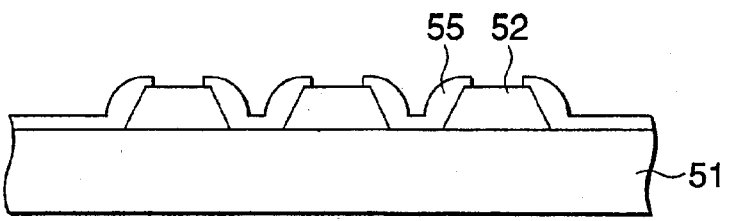

As described above, the anode patterns 2a of ITO film 2 laminated on the glass substrate 1, and the negative type resist film 5 is provided in accordance with a profile formed by the upper surfaces of the anode patterns 2a. Therefore, the overall surface can be made to be a uniformly flat surface. Accordingly, it is possible to adopt a structure in which resistance can be reduced by increasing the thickness of ITO film 2 as shown in the example of FIG. 4. Further, since the edge portions of the anode patterns 2a are connected with the negative type resist film 5, even when the organic thin film 6 and the cathode 7 as a second electrode are laminated as shown in FIG. 2E, the edge portions are not recessed downward. For this reason, there is no possibility of the occurrence of defective coverage of the organic thin film 6, and short circuit between the anode patterns 2a and the cathode 7 can be positively prevented.

In the above embodiment, anode can be made of first line patterns arranged with predetermined interval regions and cathode is made of plurality of second line patterns arranged in perpendicular to the first line patterns. In the case, each of regions sandwiched with the first lines and the second lines constructs each EL element, and EL elements are arranged in a matrix pattern shaped on a substrate. The organic film can be formed so as to cover the first electrodes and the photoresist, as a whole, or independently one by one.

Further, photosensitive film can be embedded by etching back step without forming the operational film. Namely the method of fabricating an organic electroluminescence device, is according to the following steps of: forming first electrodes of a transparent conductive film on a transparent substrate; coating a photosensitive film on an entire surface of the substrate on which the first electrodes are formed; flatting a surface of the substrate by etching back the photosensitive film so that the photosensitive film disposed between the first electrodes, is remained; forming an organic thin film on the first electrodes and the photosensitive film remained; and forming a second electrode on the organic thin film.

In the first of the present application, even if the thickness of the first electrode is increased, the occurrence of defective coverage of the organic thin film at the edge portion can be prevented, and short circuit between the first and the second electrode can be positively prevented. Therefore, the above structure can be adopted to a display of a large image plane, the resistance of which must be low, and also the above structure can be adopted to a display of high resolution.

According to the second of the present application, the operational film through which no light is transmitted is formed corresponding to the first electrode. Therefore, only when the negative type resist film is laminated, exposed to light and developed, it is possible to leave the cured negative type resist film as it is in the interval between the first electrodes. Therefore, a burden required for mask alignment can be reduced, and the working time can be shortened. Accordingly, the yield of products can be enhanced.

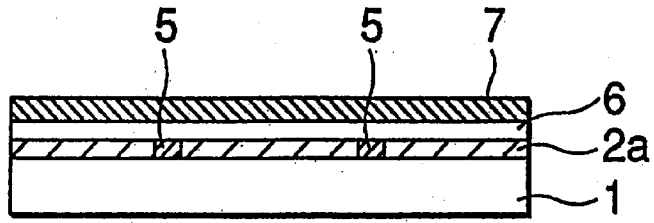

What is claimed is:

1. An organic electroluminescence device comprising: a plurality of first electrodes of transparent conductive film patterns formed on a transparent substrate:
   an organic thin film formed on the first electrodes; and
   a second electrode formed on the organic thin film, wherein a recess, which is an interval region between the first electrodes, is embedded with a photo resist,
   the thickness of the photo resist is as same as that of the first electrode.

2. An organic electroluminescence device comprising: a plurality of first electrodes of transparent conductive film patterns formed on a transparent substrate:
   an organic thin film formed on the first electrodes; and
   a second electrode formed on the organic thin film, wherein a recess, which is an interval region between the first electrodes, is embedded with a photo resist, wherein the photo resist is made of photocurable resin cured by exposing the photocurable resin to light.

3. An organic electroluminescence device comprising: a plurality of first electrodes of transparent conductive film patterns formed on a transparent substrate:
   an organic thin film formed on the first electrodes; and
   a second electrode formed on the organic thin film, wherein a recess, which is an interval region between the first electrodes, is embedded with a photo resist, wherein the first electrodes are made of ITO film patterns, and the second electrode is made of a metal film.

4. An organic electroluminescence device comprising: a plurality of first electrodes of transparent conductive film patters formed on a transparent substrate:
   an organic thin film formed on the first electrodes; and
   a second electrode formed on the organic thin film, wherein a recess, which is an interval region between the first electrodes, is embedded with a photo resist, wherein the first electrodes are made of the first line patterns arranged with predetermined interval regions; the photo resist is embedded in the interval regions so that the thickness is as same as that of the first electrodes; the organic film is formed so as to cover the first electrodes and the photo resist and the second electrode is made of plurality of second line patterns arranged in perpendicular to the first line patterns.

5. An organic electroluminescence device comprising: a plurality of first electrodes of transparent conductive film patterns formed on a transparent substrate:
   an organic thin film formed on the first electrodes; and
   a second electrode formed on the organic thin film, wherein a recess, which is an interval region between the first electrodes, is embedded with a photo resist, wherein the recess is embedded with the photo resist so that a uniformly flat surface is formed across the first electrodes and photo resist.

* * * * *

UNITED STATES PATENT AND TRADEMARK OFFICE
CERTIFICATE OF CORRECTION

PATENT NO. : 6,416,886
DATED : July 9, 2002
INVENTOR(S) : Akira Gyoutoku and Hideaki Iwanaga It is certified that error appears in the above-identified patent and that said Letters Patent is hereby corrected as shown below:

Title page,
The Title page showing the illustrative figure should be deleted to be replaced with the attached title page.
Item [75], Inventors, delete "Kiyama-machi", and insert therefor -- Saga --; and delete "Umi-machi", and insert therefor -- Fukuoka --.
Item [57], ABSTRACT,
Line 1, delete "electroluminescent", and insert therefor -- electroluminescence --.

Drawings,
Drawing sheets, consisting of Figs. 1-4, should be deleted to be replaced with the drawing sheets, consisting of Figs. 1-4, as shown on the attached page.

Signed and Sealed this

Seventeenth Day of December, 2002

JAMES E. ROGAN
*Director of the United States Patent and Trademark Office*

(12) United States Patent
Gyoutoku et al.

(10) Patent No.: US 6,416,886 B1
(45) Date of Patent: Jul. 9, 2002

(54) ORGANIC ELECTROLUMINESCENCE DEVICE AND MANUFACTURING METHOD THEREOF

(75) Inventors: Akira Gyoutoku, Kiyama-machi; Hideaki Iwanaga, Umi-machi, both of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/170,556

(22) Filed: Oct. 13, 1998

(30) Foreign Application Priority Data

Oct. 14, 1997 (JP) .............................. 9-280124

(51) Int. Cl.[7] .................................. H05B 33/02
(52) U.S. Cl. ............... 428/690; 428/917; 313/503; 313/505; 257/91; 257/99
(58) Field of Search ................... 428/690, 917; 313/503, 505; 257/91, 99

(56) References Cited

U.S. PATENT DOCUMENTS

| | | | | |
|---|---|---|---|---|
| 4,342,945 A | * | 8/1982 | Ketchpel | 313/505 |
| 5,189,549 A | * | 2/1993 | Leventis et al. | 359/271 |
| 5,400,047 A | * | 3/1995 | Beesley | 313/503 |
| 5,742,129 A | * | 4/1998 | Nagayama et al. | 315/167 |
| 5,952,037 A | * | 9/1999 | Nagayama et al. | 427/66 |
| 6,107,734 A | * | 8/2000 | Tanaka et al. | 313/506 |
| 6,111,356 A | * | 8/2000 | Roitman et al. | 313/506 |

* cited by examiner

*Primary Examiner*—Cynthia H. Kelly
*Assistant Examiner*—Dawn Garrett
(74) *Attorney, Agent, or Firm*—Pearne & Gordon LLP

(57) ABSTRACT

An organic electroluminescent device comprising a plurality of first electrodes of transparent conductive film patterns formed on a transparent substrate; an organic thin film formed on the first electrodes; and a second electrode formed on the organic thin film, wherein a recess, which is an interval region between the first electrodes, is embedded with a photo resist. Therefore, even if the thickness of the first electrodes is increased, the occurrence of defective coverage at the edge portion of first electrodes can be prevented.

5 Claims, 4 Drawing Sheets